United States Patent
Guenther

(10) Patent No.: US 11,163,455 B2
(45) Date of Patent: Nov. 2, 2021

(54) MEASURING DEVICE FOR MEASURING SIGNALS AND DATA HANDLING METHOD

(71) Applicant: Rohde & Schwarz GmbH & Co. KG, Munich (DE)

(72) Inventor: Mario Guenther, Glauchau (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/653,005

(22) Filed: Jul. 18, 2017

(65) Prior Publication Data
US 2018/0121113 A1   May 3, 2018

(30) Foreign Application Priority Data

Oct. 31, 2016   (EP) ..................................... 16196548

(51) Int. Cl.
*G06F 12/00* (2006.01)
*G06F 3/06* (2006.01)
(Continued)

(52) U.S. Cl.
CPC ........... *G06F 3/0619* (2013.01); *G01R 1/025* (2013.01); *G01R 13/029* (2013.01);
(Continued)

(58) Field of Classification Search
CPC ...... G06F 3/0619; G06F 3/0629; G06F 3/067; G06F 12/1408; G06F 12/1458;
(Continued)

(56) References Cited

U.S. PATENT DOCUMENTS

| | | | |
|---|---|---|---|
| 5,719,761 A | * | 2/1998 | Gatti .................... A61M 5/172 604/67 |
| 5,790,806 A | * | 8/1998 | Koperda ............. H04L 12/2801 348/E7.071 |

(Continued)

FOREIGN PATENT DOCUMENTS

CN           2938113 Y        8/2007

OTHER PUBLICATIONS

Search Report from European Patent Application No. 16196548.8, dated Apr. 18, 2017, 7 pages.

(Continued)

*Primary Examiner* — Mark A Giardino, Jr.
(74) *Attorney, Agent, or Firm* — Westman, Champlin & Koehler, P.A.

(57) ABSTRACT

The present invention provides a measuring device (1, 11) for measuring signals (2, 12), the measuring device (1, 11) comprising a data memory (4, 14) configured to store device data (5, 15) for the measuring device (1, 11), and a data interface (6, 16) connected to the data memory (4, 14) and configured to read the device data (5, 15) from the data memory (4, 14) and output at least a part of the read device data (5, 15) to an external memory device (7, 17) in a storage mode and to read device data (5, 15) from the external memory device (7, 17) and store the read device data (5, 15) in the data memory (4, 14) in a recovery mode. The present invention further provides a corresponding method for such a measuring device (1, 11).

20 Claims, 3 Drawing Sheets

(51) Int. Cl.
*G01R 13/02* (2006.01)
*G01R 1/02* (2006.01)
*G01R 13/20* (2006.01)
*G06F 12/14* (2006.01)
*G06F 13/00* (2006.01)
*G06F 13/28* (2006.01)
*G01R 31/3193* (2006.01)

(52) U.S. Cl.
CPC ........... *G01R 13/208* (2013.01); *G06F 3/067* (2013.01); *G06F 3/0629* (2013.01); *G06F 12/1408* (2013.01); *G06F 12/1458* (2013.01); *G01R 31/31935* (2013.01); *G06F 2212/402* (2013.01)

(58) Field of Classification Search
CPC . G06F 2212/402; G01R 1/025; G01R 13/029; G01R 31/31935; G01R 13/208
See application file for complete search history.

(56) References Cited

U.S. PATENT DOCUMENTS

| | | | | |
|---|---|---|---|---|
| 6,192,416 | B1* | 2/2001 | Baxter | H04L 63/08 707/999.202 |
| 2002/0016912 | A1* | 2/2002 | Johnson | G06F 11/1464 713/165 |
| 2002/0024538 | A1* | 2/2002 | Bandaru | G06F 17/30265 715/764 |
| 2003/0201904 | A1* | 10/2003 | Seal | G11C 16/102 340/870.02 |
| 2004/0139309 | A1* | 7/2004 | Gentil | G06F 9/4451 713/1 |
| 2006/0001666 | A1 | 1/2006 | Cake et al. | |
| 2007/0206496 | A1 | 9/2007 | Roy et al. | |
| 2008/0100414 | A1* | 5/2008 | Diab | G06F 21/35 340/5.1 |
| 2011/0040808 | A1* | 2/2011 | Joy | G06F 8/20 707/812 |
| 2011/0314304 | A1* | 12/2011 | Braams | G06F 21/79 713/193 |
| 2012/0117419 | A1* | 5/2012 | Hillman | G06F 11/073 714/12 |
| 2012/0197572 | A1 | 8/2012 | Braunstorfinger et al. | |
| 2014/0058692 | A1 | 2/2014 | Wen et al. | |
| 2014/0145966 | A1* | 5/2014 | Gardenfors | G06F 3/012 345/173 |
| 2016/0239031 | A1* | 8/2016 | Koh | G05B 15/02 |
| 2017/0295486 | A1* | 10/2017 | Lin | H04W 8/183 |

OTHER PUBLICATIONS

Paulet M. et al., "Oscilloscope with PC Interface to Save and Wireless Transmission of Data", 2012 International Conference and Exposition on Electrical and Power Engineering (EPE 2012), Oct. 25-27, Iasi, Romania, 4 pages.

"USB flash drive and device ports | Tektronix", Website Article, http://www.tek.com/manualtopicusbflashdriveanddeviceports, dated Sep. 1, 2016, 7 pages.

U.S. Appl. No. 60/779,179, filed Mar. 3, 2006, 7 pages.

* cited by examiner

MEASURING DEVICE FOR MEASURING SIGNALS AND DATA HANDLING METHOD

CROSS-REFERENCE TO RELATED APPLICATIONS

This application is a non-provisional application of European Application No. 6196548.8, filed on Oct. 31, 2016, the contents of which is hereby incorporated in its entirety.

TECHNICAL FIELD

The present invention relates to a measuring device for measuring signals. The present invention further relates to a data handling method for such a measuring device.

BACKGROUND

Although applicable in principal to any system that may be used to record data, the present invention and its underlying problem will be hereinafter described in combination with dedicated measurement devices like oscilloscopes.

Oscilloscopes usually have to be configured for a specific measurement task. Therefore, every user of an oscilloscope usually initiates a measurement session with a time consuming configuration phase. Further, after turning the oscilloscope off, some oscilloscopes may lose the configuration data.

Against this background, the problem addressed by the present invention lays in providing improved measurement devices.

SUMMARY

The present invention solves this object by a measuring device with the features of claim 1 and a method with the features of claim 13.

Accordingly it is provided:

A measuring device for measuring signals, the measuring device comprising a data memory configured to store device data for the measuring device, and a data interface connected to the data memory and configured to read the device data from the data memory and output at least a part of the read device data to an external memory device in a storage mode and to read device data from the external memory device and store the read device data in the data memory in a recovery mode.

A data handling method for a measuring device for measuring signals, the method comprising providing device data for the measuring device in the measuring device, reading the device data and outputting at least a part of the read device data to an external memory device in a storage mode, and reading the device data from the external memory device and storing the read device data in the measuring device in a recovery mode, i.e. overwriting the previously stored device data.

The measuring device can e.g. measure electronic signals, especially in electronic circuits or electronic signals detected by any kind of measurement probes. The measuring device can e.g. also perform signal analysis on the measured signals. The measuring device can therefore e.g. comprise an oscilloscope, a network analyzer, a logic analyzer or the like.

The device data can be any data that is provided to the measuring device, e.g. by a user, or generated by the measuring device. The data memory in the measuring device serves to hold the device data at least during configuration and operation of the device.

In complex measurement environments users may configure the measuring device in a time consuming configuration phase. Further, while performing the measuring task, the user may change the configuration of the measuring device. All these changes will reflect in the device data.

With the help of the data interface two different tasks can be accomplished. On the one hand, the data interface can be used to back up the device data, e.g. to a mobile memory device like a USB stick. On the other hand, stored or backed up device data can be loaded from the memory device into the data memory and be used, e.g. by a processing unit of the measuring device to configure the measuring device accordingly.

It is understood, that the term data interface refers to an entity that can comprise a plurality of single units, like hardware interfaces, communication controllers, processors and the like.

Based on the finding of the present invention, the user can therefore reuse device data on a measuring device or transfer the device data to other measuring devices.

Further embodiments of the present invention are subject of the further subclaims and of the following description, referring to the drawings.

In a possible embodiment, the device data can comprise parameter data and/or measurement data. The parameter data in the present context represents any data, which is provided to the measuring device and/or used by the measuring device as a basis for performing any measurement. Usually a user can configure various parameters in measuring devices, like e.g. a sampling rate, voltage and/or current ranges, input types, probes used on the inputs, display settings, units, axis values, trigger levels, marker values, mathematical formulas, signal enumerator settings, and the like. The parameter data can also comprise reference waveforms, especially digital waveforms, bus waveforms, analog waveforms or the like. The parameter data can therefore e.g. define any one of the plurality of user configurable parameters in the measuring device.

In sum the parameter data defines a measurement scenario, for which the measuring device is configured by the parameter data.

The measurement data in contrast to the parameter data refers to the data, which is acquired or generated during a measurement by the measuring device. The measurement data therefore can represent the contents or results of a measurement scenario, analysis data for the measurements, screenshots or the like.

In a possible embodiment, the data memory can be a volatile data memory. A volatile data memory loses its contents when the power supply is turned off. Therefore, by using a volatile data memory the device data is automatically deleted e.g. when a user switches off the measuring device. This prevents e.g. unauthorized access to the device data.

In a possible embodiment, the data memory can be a non-volatile data memory. In contrast to a volatile data memory, a non-volatile or permanent data memory, like e.g. a hard disk, solid state drive, a memory card or the like, does not lose its contents when the power supply is turned off. This allows reusing device data and e.g. continuing a measurement after a break.

In a possible embodiment, the data interface can be configured to detect when the external memory device is connected and to automatically transfer the device data to the external memory device after it is connected. An automatic transfer of the device data is the quickest and for the user easiest possibility to back up the device data.

In a possible embodiment, the measuring device can comprise an encryption unit configured to encrypt the device data. If the device data is encrypted, e.g. with a user-defined password, the device data can be protected from unauthorized access in the measuring device. However, with the correct password the device data can de decrypted and be re-used. The device data can then be re-used in the same measuring device that was used to encrypt the device data or in any other compatible measuring device. The device data can also be encrypted in the data memory or when it is transferred to the data memory. Compatible in this context means, that the measuring device can make use of the device data, e.g. to analyze measurement results or perform further measurements. Accordingly, a device is also compatible if it can only perform a subset of the measurements or make use of a subset of the device data.

In a possible embodiment, the measuring device can comprise an identification interface configured to read identification data from a user identification token. The user identification token can e.g. comprise a NFC/RFID tag, a smartcard, a USB stick with identification data. The identification interface can also be a keypad or keyboard and the identification data can be a password, or a pin.

In a possible embodiment, the encryption unit can be configured to encrypt the device data based on the identification data. With the identification interface any user can identify himself with the measuring device. This allows easily encrypting and decrypting the device data on any measuring device using the identification data. The device data can e.g. be carried on a mobile data storage, like a USB stick, and can be decrypted in a measuring device after the identification data is provided by the user.

In a possible embodiment, the data interface can comprise a network interface, which is configured to couple the measuring device with a central data server, wherein the data interface can be configured to output the device data via the network interface to the central data server or read the device data from the central data server. The data interface can be used to couple the measuring device to a data network e.g. by network cables or wirelessly. Via the data network the measuring device can then access the central data server, which can be used by the measuring device as a data repository. It is understood that the data interface can comprise a plurality of interfaces, like e.g. a USB interface, a smartcard or memory card interface or the like, at the same time as the network interface.

This allows centrally storing the device data. This on the one hand allows to include the device data in a general back up or data handling process and opposed to e.g. a USB stick the central data server cannot be lost by a user.

Further, the centrally stored device data can also be retrieved by other measuring devices. In addition, the centrally stored device data can also be further processed, e.g. by a system engineer on a PC with a dedicated analysis software.

In a possible embodiment, the data interface can be configured to retrieve the device data from the central data server based on the identification data. This means that a user can e.g. store the device data, when he leaves a measuring device and simply restore the state of the measurement unit by identifying himself with the measuring device. The data interface can e.g. be configured to automatically retrieve the respective device data after a user identification.

In a possible embodiment, the data interface can be configured to version and/or name the device data when outputting the device data. This allows to store a plurality of different configurations and retrieve the required configuration for a measurement task. The name or version can e.g. be auto-generated, especially based on data like a user identification, a date, a time or the like. In addition a user can e.g. provide name or version via a user interface. The name or version can then e.g. be used in the file name or directory name or database name, in which the device data is stored.

In a possible embodiment, the device data can comprise a full memory image of the measuring device and state information of the measuring device, which resembles the momentary state of the measuring device when the device data is recorded. The device data in this embodiment comprises every single information, which is necessary to describe the momentary state of the measuring device, i.e. of all the internal memories and registers of any processors in the measuring device. If this information is stored, the momentary state can be recovered or restored at any moment, e.g. after a user returns to the measuring device.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
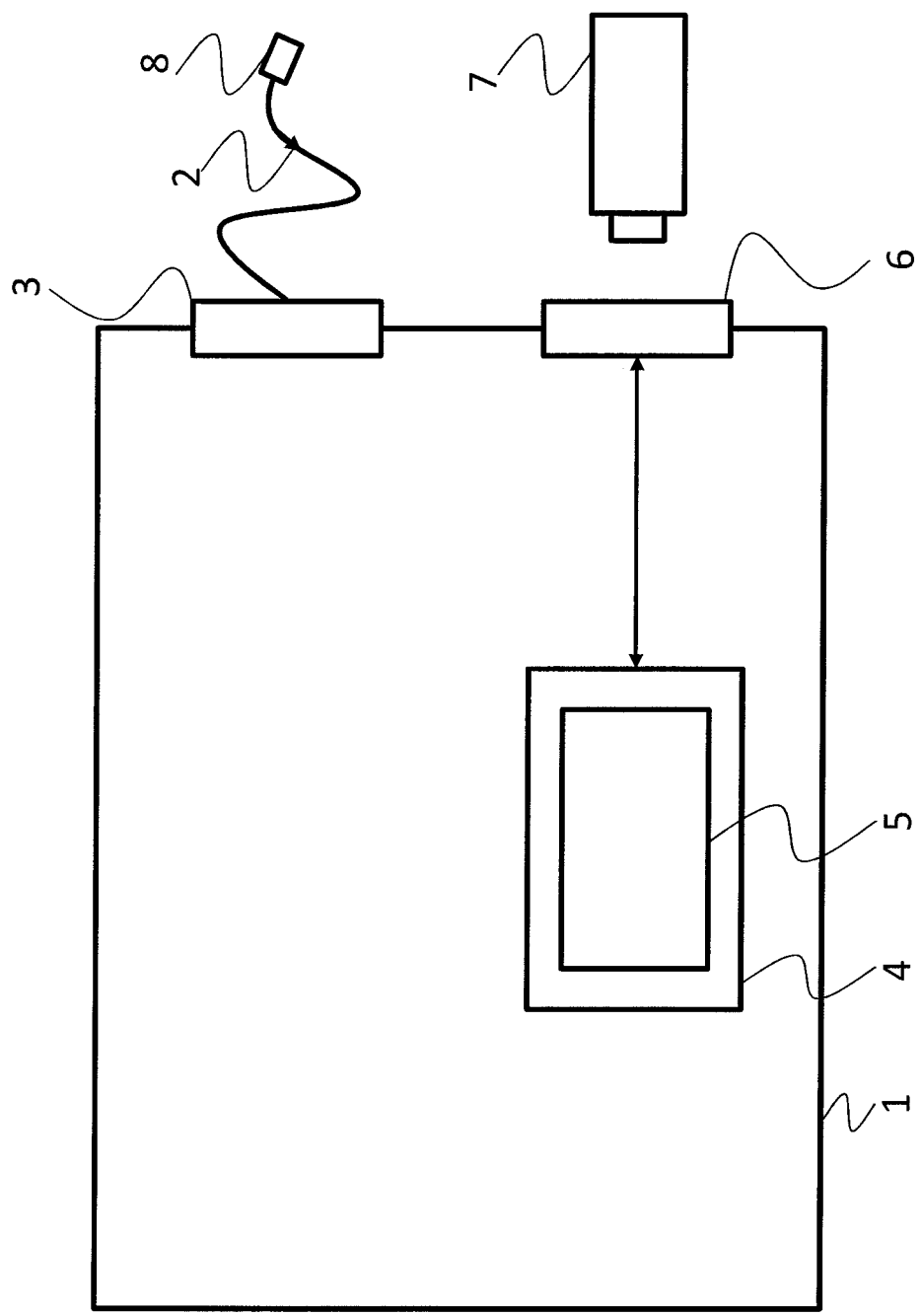
FIG. 1 shows a block diagram of an embodiment of a measuring device according to an embodiment of the present invention.

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

FIG. 1 shows a measuring device 1, which comprises a measurement interface 3 for measuring signals 2 with probe 8. The measuring device 1 can e.g. be an oscilloscope, which is used to measure electrical signals in an electrical circuit.

The measuring device 1 further comprises a volatile data memory 4, e.g. a RAM memory, which stores device data 5 for the measuring device 1. As an alternative, non-volatile data memory could also be used. The data memory 4 is further coupled to a data interface 6, which allows coupling the measuring device 1 to an external memory device 7, like a USB stick, a smart or memory card or the like.

The device data 5 may refer to any data, which is used for configuration and operation of the measuring device 1 as well as the measured signals 2 or any data about the measured signals 2. The data interface 6 allows coupling the external memory device 7 to the measuring device 1 and e.g. transferring the device data 5 from the measuring device 1 to the external memory device 7 or from the external memory device 7 to the measuring device 1, i.e. the data memory 4.

It is understood, that the external memory device 7 is just exemplarily shown as a USB-stick like device. However, any other type of external memory, like memory cards, hard disks or the like can be used.

In order to reduce the complexity of storing the device data 5 on the external memory device 7, the data interface 6 can e.g. be configured to detect when the external memory device 7 is connected. After detecting the connection of the external memory device 7 the data interface 6 can then automatically transfer the device data 5 to the external memory device 7. The data interface 6 can also configured to version or name the device data 5 individually, when outputting the device data 5. This allows storing multiple sets of device data 5 on the external memory device 7 in parallel. It is understood, that the functions of the data interface 6 can be distributed throughout the elements of the measuring device 1. For example, the computations required to implement the described functions of the data interface 6 could be implemented in a central processor or measuring processor (see FIG. 2) of the measuring device 1. The same applies to the other elements of the measuring device 1.

Figure 2:
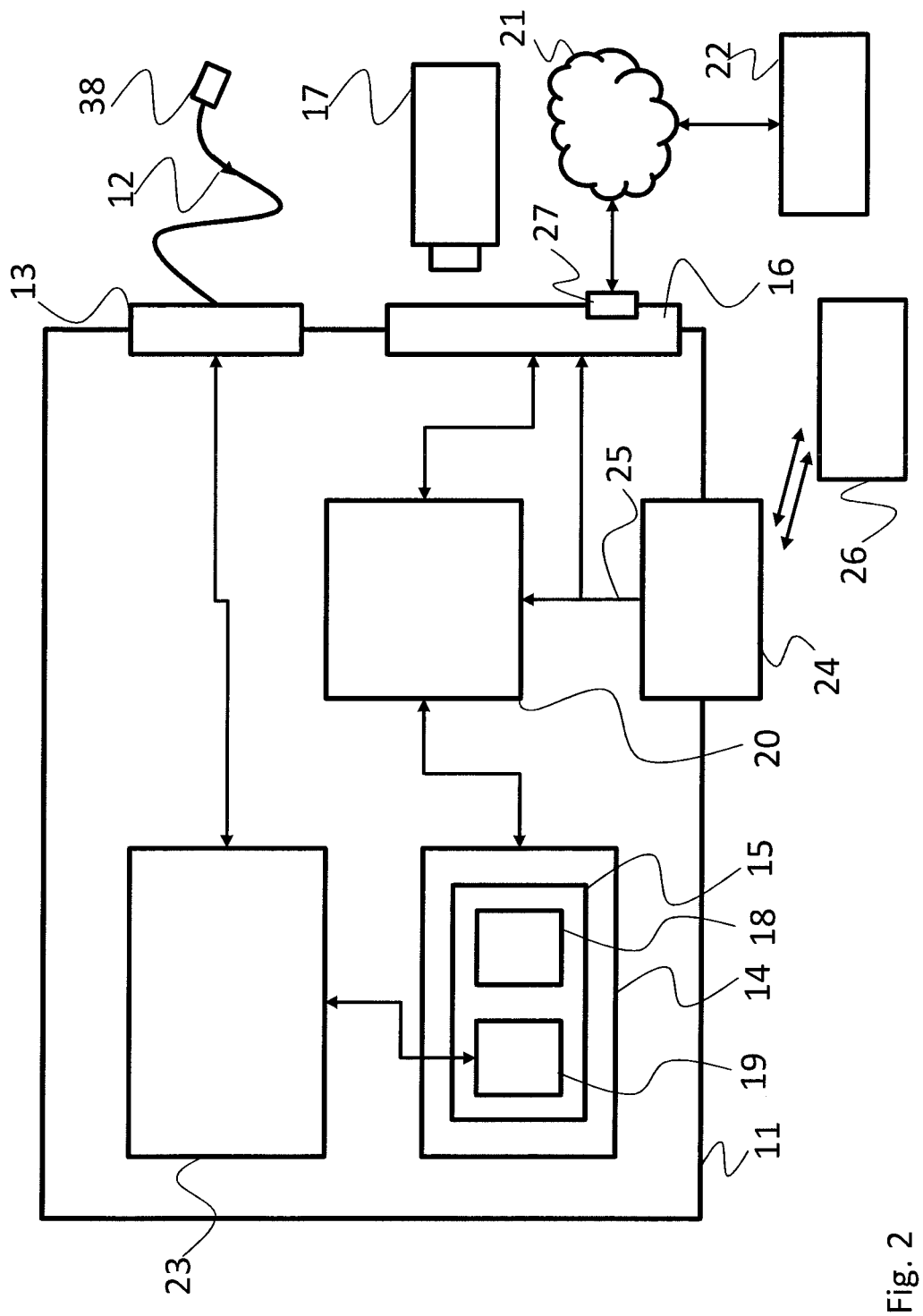
FIG. 2 shows a block diagram of another embodiment of a measuring device according to an embodiment of the present invention.

FIG. 2 shows a block diagram of another possible measuring device 11. The measuring device 11 is based on the measuring device 1 of FIG. 1 and further comprises a measurement processor 23, which can process the signals 12, which are acquired via probe 38 and the measurement interface 13. The measurement processor 23 can also comprise or be comprised in a main processor or controller of the measuring device 11.

In the measuring device 11 the device data 15 comprises parameter data 18 and measurement data 19. The parameter data 18 refers to data, which is provided to the measuring device 11 as a basis for performing measurements, e.g. configuration data. In contrast the measurement data 19 refers to any data, which is generated by the measuring device 11 during or after a measurement. However, both the parameter data 18 and measurement data 19 can be subject to the data transfer via the data interface 16. The device data 15 can also comprise a full memory image of the measuring device 11 and state information of the measuring device 11, which resembles the momentary state of the measuring device when the device data 15 is generated or stored. Such data can e.g. comprise the register values of the measurement processor 23 and the content of the memory of the measurement processor 23.

The data interface 16 in addition to the interface to the external memory device 17 also comprises a network interface 27, which couples the measuring device 11 to a data network 21 and via the data network 21 to a central data server 22.

With the network interface 27 it is now possible to store the device data 15 on the central data server 22 and retrieve stored device data 15 from the central data server 22. In addition, via the data network 21 a plurality of measuring devices 11 can store device data 15 in or retrieve device data 15 from the central data server 22. This also allows a user to e.g. store the device data 15 at one measuring device 11 and retrieve the stored device data 15 at another measuring device 11 to continue his work.

When the data network 21 and the central data server 22 are used, it may be useful to mark, e.g. name, or protect the device data 15, when it is transferred.

To this end the measuring device 11 comprises an encryption unit 20, which is just exemplarily arranged between the data memory 14 and the data interface 16. The encryption unit 20 can e.g. encrypt the device data 15 when the device data 15 is transferred to the data interface 16 or stored in the data memory 14. In addition the encryption unit 20 can decrypt the device data 15 when it is transferred from the data interface 16 to the data memory 14. It is understood, that the encryption unit 20 is just exemplarily shown as separate block in FIG. 2. Naturally, the encryption unit 20 can also be included in any other element of the measuring device 11, e.g. the measurement processor 23, or distributed function-wise in other elements of the measuring device 11.

An identification interface 24 is further coupled to the encryption unit 20 and the data interface 16. The identification interface 24 can e.g. read identification data 25 from a user identification token 26, e.g. a smartcard, a RFID or NFC token, a keypad or the like. The identification data 25 can then be used by the encryption unit 20 to encrypt or decrypt the device data 15 and by the data interface 16 to provide user information to the device data 15 or retrieve the device data 15 for the respective user. The data interface 16 can e.g. select a specific directory or file names based on the identification data 25.

Figure 3:
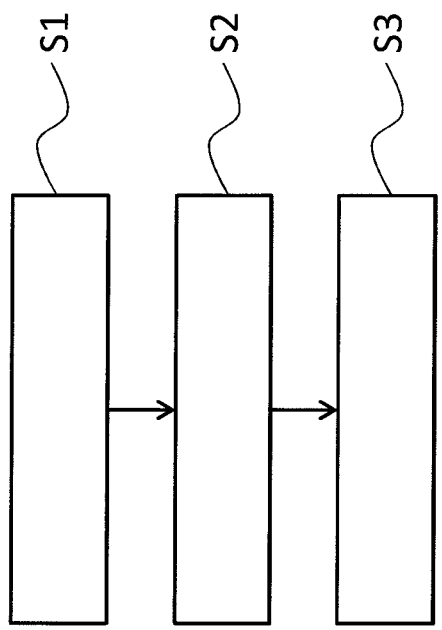
FIG. 3 shows a flow diagram of an embodiment of a method according to an embodiment of the present invention.

FIG. 3 shows a flow diagram of a data handling method for a measuring device 1, 11 for measuring e.g. electronic signals 2, 12.

The method comprises providing S1 device data 5, 15 for the measuring device 1, 11 in the measuring device 1, 11. The device data 5, 15 can e.g. comprise information provided by a user of the measuring device 1, 11. Such information can also be called parameter data 18. Further the device data 5, 15 can comprise information about the measured signals 2, 12, which can also be called measurement data 19. The device data 5, 15 can also comprise a full memory image of the measuring device 1, 11 and state information of the measuring device 1, 11, which resembles the momentary state of the measuring device when the device data 5, 15 is generated or stored.

The method further comprises reading S2 the device data 5, 15 and outputting at least a part of the read device data 5, 15 to an external memory device 7, 1 in a storage mode. In a recovery mode the device data 5, 15 is read S3 from the external memory device 7, 17 and stored in the measuring device 1, 11.

The device data 5, 15 can e.g. be stored in and read from a volatile memory or a non-volatile memory in the measuring device 1, 11.

The writing of the device data 5, 15 to the external memory device 7, 17 can be triggered manually e.g. by a user. As an alternative it can be detected when the external memory device 7, 17 is connected to the measuring device 1, 11 and the device data 5, 15 can be automatically transferred to the external memory device 7, 17 after it is connected.

Further, it is possible to encrypt or at least mark the device data 5, 15 if unauthorized access to the device data 5, 15 must be prevented. To couple the encrypted device data 5, 15 to a user the method can comprise reading identification data 25 from a user identification token 26. The identification data 25 can then be used to perform the encryption.

If identification data 25 is used to mark or encrypt the device data 5, 15, the device data 5, 15 can be retrieved from the central data server 22 based on the identification data 25.

A simple method for storing the device data 5, 15 would e.g. be to use a different directory per user. Further, the device data 5, 15 can be versioned and/or named when outputting the device data 5, 15.

To provide more flexibility in handling the device data 5, 15 the measuring device 1, 11 can also be coupled with a central data server 22. The device data 5, 15 can then e.g. be transferred via the network interface 27 to the central data server 22 or read from the central data server 22.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 1, 11 measuring device
2, 12 signals
3, 13 measurement interface
4, 14 data memory
5, 15 device data
6, 16 data interface
7, 17 external memory device
18 parameter data
19 measurement data
20 encryption unit
21 data network
22 central data server
23 measurement processor
24 identification interface
25 identification data
26 user identification token
27 network interface
8, 38 probe
S1, S2, S3 method steps

The invention claimed is:

1. A measuring device for measuring signals, the measuring device comprising:
a measurement interface for measuring signals with probe;
a measurement processor configured to process the signals measured with the probe;
a data memory configured to store device data for the measuring device,
a data interface connected to the data memory and configured to read the device data from the data memory and output at least a part of the read device data to an external memory device in a storage mode and to read device data from the external memory device and store the read device data in the data memory in a recovery mode, and
an identification interface configured to read identification data from a user identification token, wherein the identification token comprises an NFC/RFID tag,
wherein the device data comprises a full memory image of the measuring device and state information of the measuring device, which resembles the momentary state of the measurement device when the device data is recorded, wherein the state information of the measuring device comprise register values of the measurement processor and content of a memory of the measurement processor,
wherein the device data comprises measurement data, and the measurement data refers to data which is acquired or generated during a measurement by the measurement device,
wherein the external memory device is a removable mobile memory device,
wherein the data interface is configured to store multiple sets of device data on the external memory device in parallel, and
wherein the data interface is configured to name each set of device data individually when outputting the device data and select a specific directory or file name for each set of device data based on the identification data read from the NFC/RFID tag of the user identification token by the identification interface.

2. The Measuring device according to claim 1, wherein the device data comprises parameter data.

3. The Measuring device according to claim 1, wherein the data memory is a volatile data memory.

4. The Measuring device according to claim 1, wherein the data memory is a non-volatile data memory.

5. The Measuring device according to claim 1, wherein the data interface is configured to detect when the external memory device is connected and to automatically transfer the device data to the external memory device after it is connected.

6. The Measuring device according to claim 1, comprising an encryption unit configured to encrypt the device data.

7. The Measuring device according to claim 6, wherein the encryption unit is configured to encrypt the device data based on the identification data.

8. The Measuring device according to claim 1, wherein the data interface comprises a network interface, which is configured to couple the measuring device with a central data server,
 wherein the data interface is configured to output the device data via the network interface to the central data server or read the device data from the central data server.

9. The Measuring device according to claim 1, wherein the data interface is configured to retrieve the device data from a central data server based on the identification data.

10. The Measuring device according to claim 1, wherein the data interface is configured to version the device data when outputting the device data.

11. A data handling method for a measuring device for measuring signals, the method comprising:
 measuring, with a probe, signals by a measurement interface;
 processing the measured signals by a measurement processor,
 providing device data for the measuring device in the measuring device,
 reading the device data and outputting at least a part of the read device data to an external memory device in a storage mode,
 reading the device data from the external memory device and storing the read device data in the measuring device in a recovery mode, and
 reading identification data from a user identification token, wherein the identification token comprises an NFC/RFID tag,
 wherein the device data comprises a full memory image of the measuring device and state information of the measuring device, which resembles the momentary state of the measurement device when the device data is recorded, wherein the state information of the measuring device comprise register values of the measurement processor and content of a memory of the measurement processor;
 wherein the device data comprises data, and the measurement data refers to data which is acquired or generated during a measurement by the measurement device,
 wherein the external memory device is a removable mobile memory device,
 wherein the data interface is configured to store multiple sets of device data on the external memory device in parallel, and
 wherein the data interface is configured to name each set of device data individually when outputting the device data and select a specific directory or file name for each set of device data based on the identification data read from the NFC/RFID tag of the user identification token by the identification interface.

12. The Method according to claim 11, wherein device data comprises parameter data.

13. The Method according to any claim 11, wherein the device data is stored in a volatile memory in the measuring device.

14. The Method according to claim 11, wherein the device data is stored in a non- volatile memory in the measuring device.

15. The Method according to claim 11, comprising detecting when the external memory device is connected and to automatically transferring the device data to the external memory device after it is connected.

16. The Method according to claim 11, comprising encrypting the device data.

17. The Method according to claim 16, wherein encrypting the device data is performed based on the identification data.

18. The Method according to claim 11, comprising coupling the measuring device with a central data server, and outputting the device data via the network interface to a central data server or reading the device data from the central data server.

19. The Method according to claim 11, comprising retrieving the device data from a central data server based on the identification data.

20. The Method according to claim 11, comprising versioning the device data when outputting the device data.

* * * * *